United States Patent [19]

Miyasaka et al.

[11] Patent Number: 5,053,917
[45] Date of Patent: Oct. 1, 1991

[54] THIN FILM CAPACITOR AND MANUFACTURING METHOD THEREOF

[75] Inventors: Yoichi Miyasaka; Shogo Matsubara, both of Tokyo, Japan

[73] Assignee: NEC Corporation, Tokyo, Japan

[21] Appl. No.: 574,778

[22] Filed: Aug. 30, 1990

[30] Foreign Application Priority Data

Aug. 30, 1989 [JP] Japan .................................. 1-226031
Sep. 14, 1989 [JP] Japan .................................. 1-238484
Mar. 1, 1990 [JP] Japan .................................. 2-51010

[51] Int. Cl.⁵ ..................... H01G 4/10; H01G 7/00; H01L 27/02
[52] U.S. Cl. .................... 361/321; 29/25.42; 357/51
[58] Field of Search ............... 361/311, 312, 313, 320, 361/321; 357/51; 29/25.42, 25.03

[56] References Cited

U.S. PATENT DOCUMENTS 4,903,110 2/1990 Aono ...................................... 357/71
4,982,309 1/1991 Shepherd ............................ 361/321

OTHER PUBLICATIONS

IBM Technical Disclosure Bulletin 357-51 Nov. 1974, vol. 17, No. 6, pp. 1569-1570.
IBM Technical Disclosure Bulletin 357-51 Aug. 1980, vol. 23, No. 3, pp. 1058.
Isaac H. Pratt, "Characteristics of RF Sputtered Barium Titanate Thin Films", Proceedings of the IEEE, vol. 59, No. 10, Oct. 1971, pp. 1440-1447.
W. B. Pennebaker, "RF Sputtered Strontium Titanate Films", IBM J. Res. Develop., Nov. 1969, pp. 686-695.
Janda K. G. Panitz et al., "Radio-Frequency-Sputtered Tetragonal Barium Titanate Silicon," J. Vac. Sci. Technol., vol. 16, No. 2, Mar./Apr. 1979, pp. 315-318.

Primary Examiner—Donald A. Griffin
Attorney, Agent, or Firm—Burns, Doane, Swecker & Mathis

[57] ABSTRACT

This film capacitors in accordance with the present invention include a silicon electrode, a first electrode layer consisting of either one of titanium, titanium silicide, titanium nitride, tantalum, molybdenum, tungsten, tantalum silicide, molybdenum silicide, tungsten silicide, alloys thereof and compounds thereby, formed on the silicon electrode, a second electrode layer formed on it consisting of platinum, palladium or rhodium, a dielectric layer formed on it consisting of an oxide ferroelectric substance such as $BaTiO_3$ and a third electrode layer formed on top of it. As the first electrode layer, use may also be made of rhenium oxide, osmium oxide, rhodium oxide or iridium oxide.

25 Claims, 3 Drawing Sheets

THIN FILM CAPACITOR AND MANUFACTURING METHOD THEREOF

BACKGROUND OF THE INVENTION

1. Field of the Invention

The present invention relates to a thin film capacitor and a manufacturing method thereof, and more particularly to a thin film capacitor used for ICs and LSIs and a manufacturing method thereof.

2. Description of the Related Art

The electronic circuits are being miniaturized to an increasing degree as a result of advances in the integrated circuit technologies, and the miniaturization of capacitors that are indispensable in the integrated circuits as circuit elements for various kinds of electronic circuits is also becoming especially significant. The miniaturization of thin film capacitors is being delayed in the midst of a rapid progress in the miniaturization of the active elements, which is becoming a substantial factor as an obstruction for a further enhancement in the integration. The reason for this is that the dielectric thin films are limited to those materials such as $SiO_2$, $Si_3N_4$ and the like that have dielectric constant of less than 10. Therefore, it is becoming necessary to develop dielectric thin films having a large dielectric constant as a means of the miniaturization of thin film capacitors. It has been known that $BaTiO_3$, $SrTiO_3$ and $PbZrO_3$ which are perovskite type oxides and an ilmenite type oxide $LiNbO_3$ that are represented by the chemical formula $ABO_3$, or oxides belonging to ferroelectric materials such as $Bi_4Ti_3O_{12}$, have dielectric constant of larger than 100 and reaching even to 10000 in the form of a single crystal or a ceramic as the above-mentioned single composition and the mutual solid solution composition, and these oxides are being used widely for ceramic capacitors. To make these materials into thin films is extremely effective for the miniaturization of the above-mentioned thin film capacitors, and it has been studied since fairly long time ago. An example with relatively satisfactory characteristics among these researches is an article reported in "Proceedings of the IEEE", Vol. 59, No. 10, 1971, pp. 1440-1447 in which it is shown that dielectric constants of 16 (formed at room temperature) to 1900 (with a heat treatment at 1200° C.) are obtained for $BaTiO_3$ thin films that are formed by sputtering and subjected to heat treatments.

Dielectric thin films, such as the above-mentioned $BaTiO_3$, that have been formed in the past require high temperatures at the time of thin film formation in order to obtain high dielectric constants, being formed without exception on a lower electrode of a high-melting point noble metal such as platinum and palladium. The reason for doing so is that the dielectric constant of the dielectric films on aluminum, nichrome, copper and the like that are generally used as the electrode materials is reduced markedly due to the oxidation of the electrode at high temperatures or their mutual reactions with the dielectric films.

On the other hand, the electrode material used extensively for the present day highly integrated circuits is polycrystalline silicon or a low resistance silicon layer with impurities doped to a high concentration in a portion of the silicon substrate itself. In the description that follows these materials will generically be called silicon electrodes. For the silicon electrodes, the fine processing technologies have been established and have already been used extensively. Therefore, if a thin film with satisfactory high dielectric constant can be prepared on a silicon electrode, it becomes possible to apply the technology to capacitors for integrated circuits. However, it is reported that when a thin film of a high dielectric constant material is formed on silicon in accordance with the conventional technology, there will be formed in an interface a layer which is equivalent to silicon dioxide ($SiO_2$) of about 100 Å, for example, on pages 687 to 688 in an article on a $SiTrO_3$ film, IBM Journal of Research and Development, November issue, 1969, pp. 686-695. The interface layer has a low dielectric constant, and as a result, the effective dielectric constant of the high dielectric constant film formed on silicon is reduced markedly, practically impairing the advantage of the use of the material with high dielectric constant. Another example of a similar conclusion can be found on p. 316 of an article on $BaTiO_3$ published in Journal of Vacuum Science and Technology, Vol. 16, No. 2, 1979, pp. 315-318.

From an analogical inference of the above-mentioned prior art, there can be considered a means of further employing a platinum or palladium electrode between the high dielectric constant material film and the silicon electrode also in the case of using a silicon electrode as the lower electrode. The structure for this case is shown in FIG. 1. Reference numeral 11 is a silicon substrate, 12 is a low-resistance silicon electrode layer doped with a high concentration impurity such as phosphorus or arsenic, 13 is an insulating layer of such material as $SiO_2$, 14 is a platinum electrode layer, 15 is a dielectric layer, 16 is an upper electrode layer of such material as aluminum and 17 is a lead-out wiring for the lower electrode. However, the formation of the high dielectric constant material film represented by $BaTiO_3$ and $SrTiO_3$ has to be done at high temperatures as mentioned above. Accordingly, with the means shown in FIG. 1, the platinum layer 14 reacts with the silicon electrode 12 forming platinum silicide, and further, there is formed an $SiO_2$ layer on its interface with the dielectric layer 15, and as a result, the effective dielectric constant is markedly reduced analogous to the case of the silicon electrode described in the above.

SUMMARY OF THE INVENTION

Accordingly, it is an object of the present invention to provide a thin film capacitor which uses a thin film of a high dielectric constant material represented by $BaTiO_3$ or $SiTiO_3$ to have a large capacitance and is suited for application to ICs and LSIs, and a manufacturing method thereof.

According to one aspect of the present invention, there is obtained a thin film capacitor which comprises a silicon electrode, a first electrode layer formed on the silicon electrode, and consisting essentially of a member selected from the group consisting of titanium, titanium silicide, titanium nitride, tantalum, molybdenum, tungsten, tantalum silicide, molybdenum silicide, tungsten silicide, alloys thereof and compounds thereof, a second electrode layer consisting essentially of a high-melting point noble metal formed on the first electrode layer, a dielectric layer consisting essentially of an oxide ferroelectric material formed on the second electrode layer and a third electrode layer formed on the dielectric layer.

According to another aspect of the present invention, there is obtained a manufacturing method of a thin film capacitor that includes the steps of forming on a silicon electrode a first electrode layer consisting essentially of a member selected from the group consisting of titanium, titanium silicide, titanium nitride, tantalum, molybdenum, tungsten, tantalum silicide, molybdenum silicide, tungsten silicide, alloys thereof and compounds thereof, forming a second electrode layer consisting essentially of a high-melting point noble metal on the first electrode layer, forming a dielectric layer consisting essentially of an oxide ferroelectric material on the second electrode layer and forming a third electrode layer on the dielectric layer.

According to another aspect of the present invention, there is obtained a thin film capacitor which comprises a silicon electrode, a first electrode layer formed on the silicon electrode, the first electrode layer being formed essentially of a member selected from the group of rhenium oxide, osmium oxide, rhodium oxide, iridium oxide and compounds thereof, a second electrode layer consisting essentially of a high-melting point noble metal formed on the first electrode layer, a dielectric layer consisting essentially of an oxide ferroelectric material formed on the second electrode layer and a third electrode layer formed on the dielectric layer.

According to another aspect of the present invention, there is obtained a manufacturing method of a thin film capacitor that includes the steps of forming on a silicon electrode a first electrode layer consisting essentially of a member selected from the group of rhenium oxide, osmium oxide, rhodium oxide, iridium oxide and compounds thereof, forming a second electrode layer consisting essentially of a high-melting point noble metal on the first electrode layer, forming a dielectric layer consisting essentially of an oxide ferroelectric material on the second electrode layer and forming a third electrode layer on the dielectric layer.

According to another aspect of the present invention, there is obtained a method of manufacturing a thin film capacitor that includes the steps of forming on a silicon electrode a first electrode layer consisting essentially of a member selected from the group of rhenium silicide, osmium silicide, rhodium silicide, iridium silicide and compounds thereof, oxidizing the first electrode layer at 400° C. to 700° C., forming a second electrode layer consisting essentially of a high-melting point noble metal on the oxidized first electrode layer, forming a dielectric layer consisting essentially of an oxide ferroelectric material on the second electrode layer and forming a third electrode layer on the dielectric layer.

As the silicon electrode layer, a polycrystalline silicon layer or a silicon single crystal layer or a substrate doped with an impurity may be preferably employed.

As the high-melting point noble metal, platinum, palladium, rhodium or alloys thereof may be preferably used therefor.

As for the oxide ferroelectric material, a perovskite type oxide, an ilmenite type oxide or $Bi_4Ti_3O_{12}$ may be preferably employed. Further, as the perovskite type oxides, $BaTiO_3$, $SrTiO_3$, $PbTiO_3$, $PbZrO_3$ and the solid solutions thereof may be preferably used and as the ilmenite type oxides, $LiNbO_3$, $LiTaO_3$ and the solid solution thereof may be preferably used.

As the third electrode, preferable use is made of aluminum.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

First Embodiment

Figure 1:
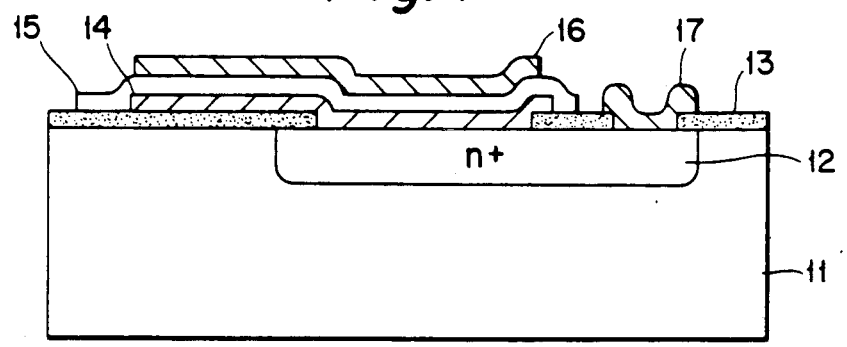
FIG. 1 is a sectional view of a thin film capacitor for explaining the thin film capacitor conceivable from the prior art.
Figure 2:
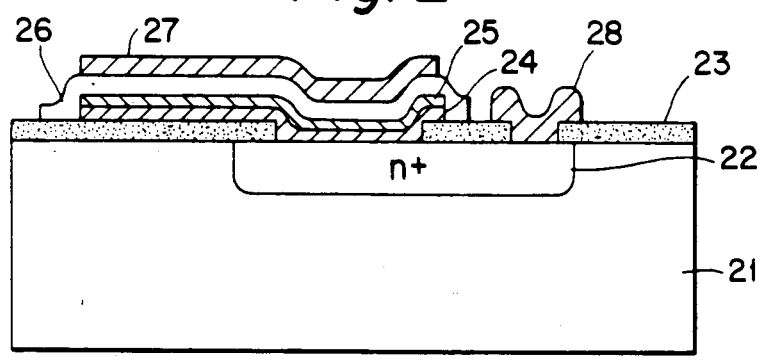
FIG. 2 is a sectional view of a thin film capacitor for explaining a first embodiment of the present invention.
Figure 3:
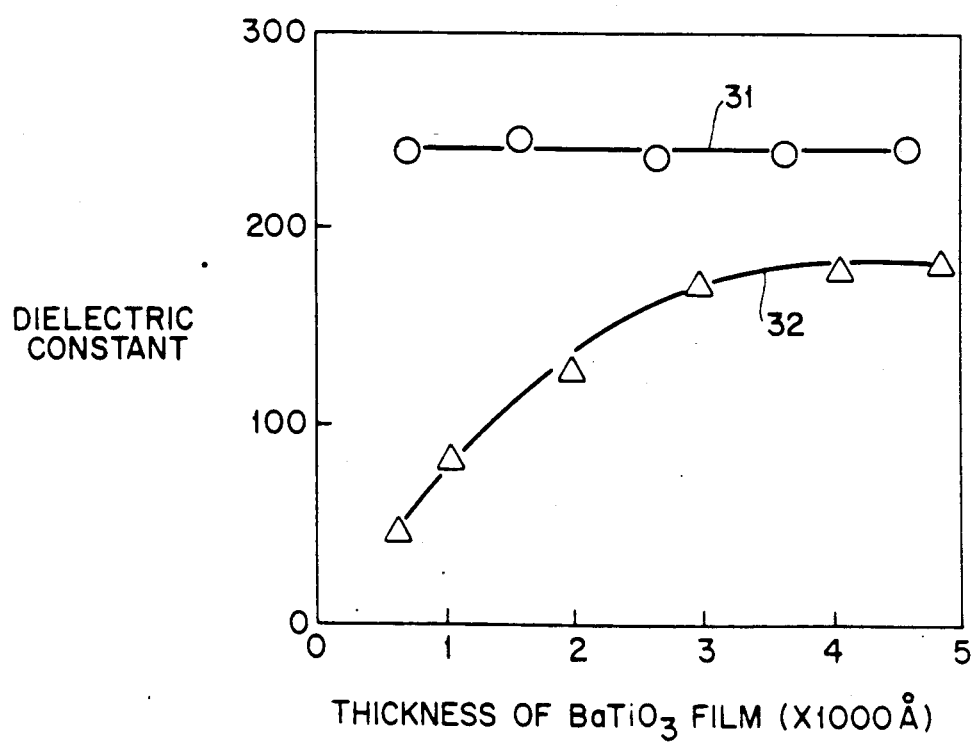
FIG. 3 is a diagram showing the relation between the dielectric constant and the film thickness for explaining the first embodiment of the present invention.

Referring to FIG. 2, 21 is a silicon substrate, 22 is a low resistance silicon electrode layer doped with impurities to a high concentration, 24 is an intermediate layer having a thickness from 500 Å to 1500 Å and consisting of a material selected from the group of titanium, titanium silicide and titanium nitride or a laminated layer thereof, 25 is a platinum electrode layer, 26 is a dielectric layer, 27 is an upper electrode layer made of aluminum or the like and 28 is a lower electrode lead-out layer made of aluminum or the like. The relation between the thickness of a $BaTiO_3$ film and the effective dielectric constant measured for the case when $BaTiO_3$ is used as the dielectric layer is shown in FIG. 3. The $BaTiO_3$ film is prepared by a high frequency magnetron sputtering that uses a target with stoichiometric composition. The film is formed in a mixed gas of argon and oxygen under a pressure of $1 \times 10^{-2}$ Torr and a substrate temperature of 400° C. to 500° C. In FIG. 3, the curve 31 shows the measured values for a sample with the configuration as shown in FIG. 2. The effective dielectric constant is seen to have a constant value of about 240 which is independent of the thickness of the $BaTiO_3$ film, showing that there are not formed layers of low dielectric constant at the interface. This characteristic is seen to be obtained for either case of using titanium, titanium silicide and titanium nitride as the intermediate layer 24. The same characteristic is also observed when a laminated intermediate layer titanium/titanium silicide, for example, is used. Here, the intermediate layer can be formed by a magnetron sputtering method by selecting either one from titanium, titanium silicide and titanium nitride as the target and adjusting the atmosphere appropriately. The curve 32 in FIG. 3 shows the result of measurement on a sample with the configuration shown in FIG. 1 for the purpose of comparison. In this case the effective dielectric constant goes down with the reduction in the thickness of the $BaTiO_3$ film, indicating clearly that there are generated layers of low dielectric constant at the interface.

Second Embodiment

Figure 4:
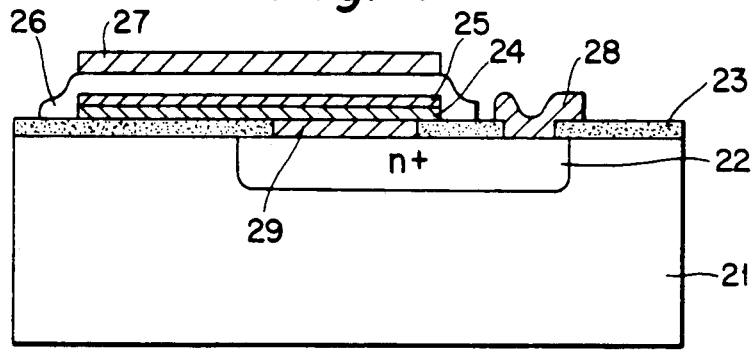
FIG. 4 is a sectional view of a thin film capacitor for explaining a second embodiment of the present invention.

Another embodiment of the present invention is shown in FIG. 4. Reference numerals 21 to 28 are the same as in FIG. 2 and 29 is a low resistance polycrystalline silicon layer. In the recent integrated circuits, accompanying the element dimensions which are becoming increasingly small, flattening of the devices is demanded strongly in order to enhance the processing accuracy. The present embodiment uses flat layers of electrodes and dielectric material and is realized by forming a low resistance polycrystalline silicon layer 29 in a contact opening part formed in the insulating layer 23, then forming an intermediate layer 24 and a platinum layer 25.

Third Embodiment

Figure 5:
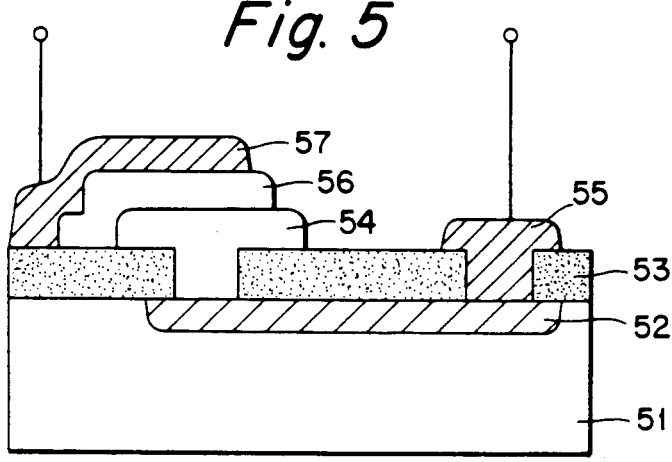
FIG. 5 is a sectional view of a thin film capacitor for explaining a third embodiment of the present invention.

Referring to FIG. 5, a low resistance layer 52 is formed by doping phosphorus to a high concentration in a part of the surface of single crystal silicon 51, and a silicon oxide film 53 is formed on top of it as an interlayer insulating film. A couple of contact holes are formed in parts of the silicon oxide film 53 for leading out the lower electrode through the low resistance layer 52, one of the contact holes is filled with a polycrystalline silicon film 54 while the other contact hole is filled with an aluminum film 55. Accordingly, the aluminum film 55 will serve as a terminal of the lower electrode. The lower electrode film 54 not only fills the contact hole but also part of it may be formed on the silicon oxide film 53. A BaTiO$_3$ film 56 is formed on the lower electrode film 54, and an aluminum film 57 is formed on top of it as an upper electrode.

Figure 6:
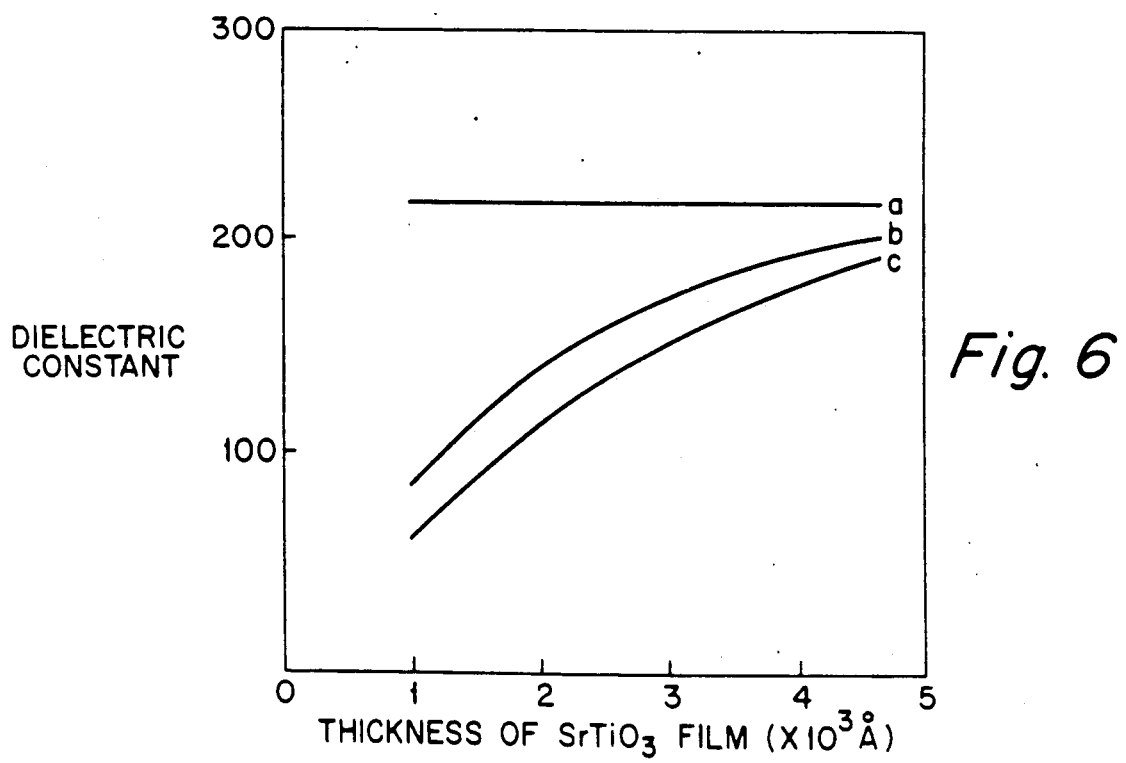
FIG. 6 is a diagram showing the relation between the dielectric constant and the film thickness for explaining the third embodiment of the present invention.

A multilayered film of platinum and titanium of the conductive layer for the present embodiment are prepared by a dc magnetron sputtering in an argon atmosphere under a pressure of $4 \times 10^{-3}$ Torr and a substrate temperature of 100° C. to the thicknesses of 3000 and 500 Å, respectively. The BaTiO$_3$ film 56 with thickness of 5000 Å is prepared by a high frequency magnetron sputtering using a powder target of stoichiometric composition. The film is formed in a mixed gas of argon and oxygen under a pressure of $1 \times 10^{-2}$ Torr and a substrate temperature of 600° C. An aluminum film of 5000 Å is formed as the upper electrode by a dc sputtering. The effective area of the present capacitor is 250 µm$^2$. Next, the differences in the characteristics of the BaTiO$_3$ film for the case of using the multilayered film of platinum and titanium of the present embodiment and the case of using only a platinum film which is a high melting point noble metal as the conductive layer, and the case of forming no conductive layer. The result of investigations of the dependence of the dielectric constant of the BaTiO$_3$ film on the thickness of the film for the case of using the platinum and titanium multilayered film of the present embodiment, the case of using a platinum film of thickness of 3000 Å and the case of using a 3000 Å-thick polycrystalline silicon film with sheet resistance of 100 Ω/cm$^2$ are shown in FIGS. 6(a), 6(b) and 6(c), respectively. In contrast to a constant value of the dielectric constant of the BaTiO$_3$ film with no dependence on the film thickness for the case of using the multilayered film of the present embodiment, the dielectric constant of the BaTiO$_3$ film is reduced markedly with the decrease in the thickness of the dielectric film for the cases of using the platinum film and the polycrystalline film.

The fall of the dielectric constant in the case of the polycrystalline silicon film is caused by the formation of a layer of low dielectric constant due to oxidation of silicon at the interface between the dielectric film and the electrode as has been reported in the past. The drop in the dielectric constant in the case of the platinum film is due to the formation of the silicide compound of platinum. Namely, silicon reacts with platinum during the formation of the dielectric film at 600° C., and reaches the uppermost surface while forming the silicide compound. It is considered that silicon that reached the uppermost surface is oxidized to form a layer of low dielectric constant similar to the case of the polycrystalline silicon film. It is confirmed by X-ray diffraction that silicidation of platinum occurred after the formation of the dielectric film. In contrast to this, it is confirmed also by X-ray diffraction that in the case of the multilayered frim of platinum and titanium, platinum remains in its original state without silicidation thereof even after the formation of the dielectric film. That is, the diffusion of silicon is obstructed by the titanium layer without being able to reach the platinum layer, so that the formation of a layer with low dielectric constant due to the oxidation of silicon, as mentioned above, will not occur.

It should be noted that an effect similar to the above can be obtained by the use of the high melting point metals such as tantalum, molybdenum and tungsten or their silicides instead of titanium of the conductive layer of the present embodiment. Moreover, a high melting point noble metal palladium or rhodium may be used in place of platinum.

Fourth Embodiment

This represents an embodiment of the present invention in which alloy films or multilayered films formed by the high melting point metals and their silicides are used as the first layer of the conductive layer in a thin film capacitor with the same configuration as the third embodiment. The materials used for the present embodiment are summarized in Table 1.

TABLE 1

| | | |
|---|---|---|
| 1 | Alloy Film | Mo 20at % - Ti 80at %, 500 Å |
| 2 | Alloy Film | W 20at % - Mo 80at %, 500 Å |
| 3 | Alloy Film | Ta 50at % - Ti 50at %, 500 Å |
| 4 | Alloy Film | TaSi 50at % - TiSi 50at %, 500 Å |
| 5 | Multilayered Film | Mo(300 Å)/Ti(200 Å) |
| 6 | Multilayered Film | W(300 Å)/Mo(200 Å) |
| 7 | Multilayered Film | Ta(300 Å)/Ti(200 Å) |
| 8 | Multilayered Film | TaSi(300 Å)/TiSi(200 Å) |

In accordance with the present embodiment, the dielectric constant of the BaTiO$_3$ film maintained its intrinsic value without having dependence on the film thickness, and was possible to prevent the formation at the interface of a layer with low dielectric constant, analogous to the third embodiment. Moreover, it was confirmed by X-ray diffraction that silicidation of platinum of the second layer dose not occur.

Fifth Embodiment

This is an embodiment of the present invention in which alloy films or multilayered films formed by the high melting point noble metals platinum, palladium and rhodium are used as the second layer of the conductive layer in a thin film capacitor with the same configuration as the third embodiment. The materials used in the present embodiment are listed in Table 2.

TABLE 2

| | | |
|---|---|---|
| 1 | Alloy Film | Pt 85at % - Rh 15at %, 1500 Å |
| 2 | Alloy Film | Pt 80at % - Pd 20at %, 1500 Å |
| 3 | Alloy Film | Pd 90at % - Rh 10at %, 1500 Å |
| 4 | Multilayered Film | Pt(1000 Å)/Rh(500 Å) |
| 5 | Multilayered Film | Pt(1000 Å)/Pd(500 Å) |
| 6 | Multilayered Film | Pd(1000 Å)/Rh(500 Å) |

In the present embodiment it was also possible to obtain an intrinsic dielectric constant of the $BaTiO_3$ film independent of the film thickness, and to prevent the formation of a layer with low dielectric constant at the interface, analogous to the third embodiment. Moreover, it was confirmed by X-ray diffraction that silicadation of the alloy film or the multilayered film of high melting point noble metals of the second layer of the conductive layer does not occur.

It is to be noted that the description in the above has been given in conjunction with $BaTiO_3$. However, a result of similar preparation and evaluation by the use of $SrTiO_3$, $PbTiO_3$, $PbZrO_3$, $LiNbO_3$, $LiTaO_3$, $Bi_4Ti_3O_{12}$ and the solid solutions $(Ba,Sr)TiO_3$, $(Ba,Pb)TiO_3$ and $Pb(Zr,Ti)O_3$ showed that the dielectric constants intrinsic to the respective dielectric films that are independent of the film thicknesses can be obtained by the method of manufacturing analogous to the case of $BaTiO_3$.

Sixth Embodiment

Figure 7:
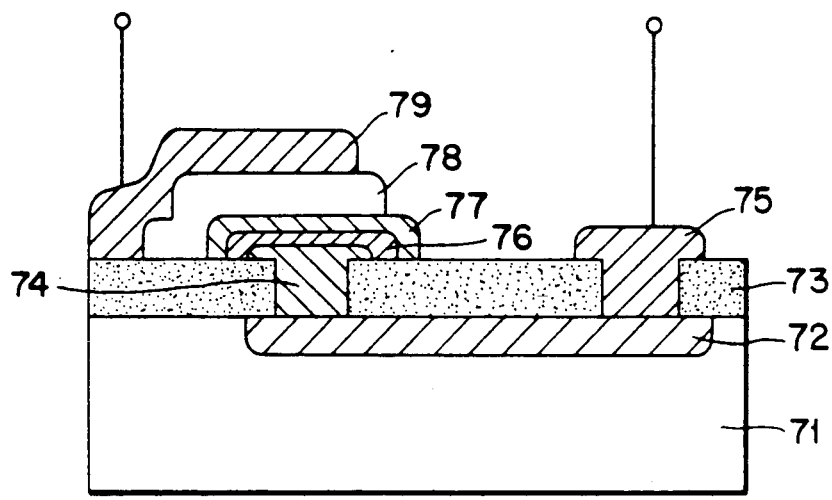
FIG. 7 is a sectional view of a thin film capacitor for explaining a sixth embodiment of the present invention.

Referring to FIG. 7, a low resistance layer 72 with highly doped phosphorus is formed in a part of the surface of single crystal silicon 71, and a silicon oxide film 73 is formed on top of it as an interlayer insulating film. Two contact holes for leading out the lower electrode through the low resistance layer are formed in parts of the silicon oxide film 73, one of the contact holes is filled with a polycrystalline silicon film 74 while the other contact hole is filled with an aluminum film 75. Accordingly, the aluminum film 75 will be served as the terminal of the lower electrode. The lower electrode film 74 fills the contact hole, and a part of it may be formed on the silicon oxide film 73. On the lower electrode film 74, a first layer 76 and a second layer 77 of a conductive layer are formed, a $BaTiO_3$ film 78 is formed on it, and an aluminum film 79 is further formed on top of it as an upper electrode.

Figure 8:
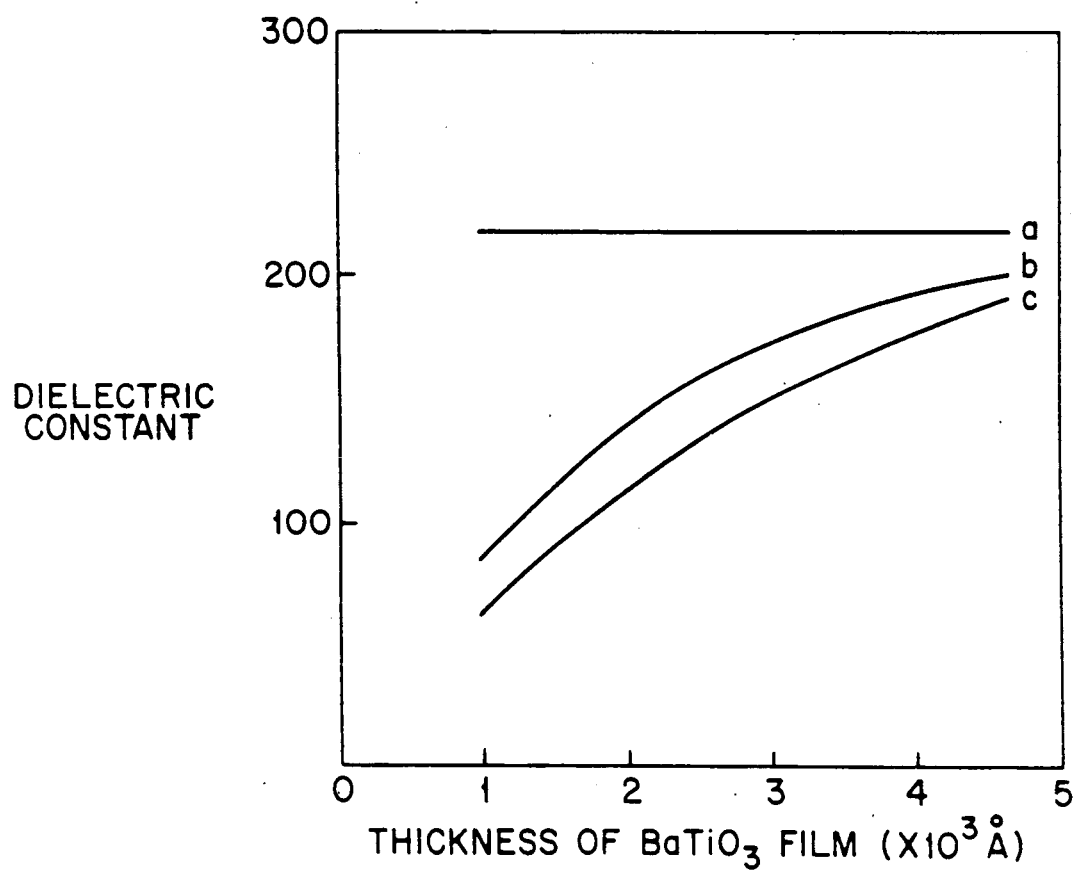
FIG. 8 is a diagram showing the relation between the dielectric constant and the film thickness for explaining the sixth embodiment of the present invention.

The first layer 76 of rhenium oxide and the second layer of platinum of the conductive layer are formed sequentially by a dc magnetron sputtering method using an $ReO_3$ and a Pt targets, respectively. The film formation is carried out in an atmosphere of argon gas under a pressure of $4 \times 10^{-3}$ Torr and a substrate temperature of 100° C., with the thicknesses of both of platinum and rhenium oxide set at 1500 Å. The $BaTiO_3$ film 78 is prepared by a high frequency magnetron sputtering to a thickness of 3000 Å using a powder target of stoichiometric composition in a mixed gas argon and oxygen under a pressure of $1 \times 10^{-2}$ Torr and a substrate temperature of 600° C. The upper electrode is formed as an aluminum film with thickness of 5000 Å by a dc sputtering method. The effective area of the present capacitor is 250 $\mu m^2$. Next, the differences in the characteristics of the $BaTiO_3$ film will be described for the case of using platinum and rhenium oxide of the present embodiment as the conductive layer, the case of using only a platinum film which is a high melting point noble metal and the case of not forming a conductive layer. The dependence of the dielectric constant of the $BaTiO_3$ film on the film thickness for the case of using the multilayered film of platinum and rhenium oxide of the present embodiment, the case of using a platinum film of thickness of 3000 Å and the case of using a polycrystalline film of thickness of 3000 Å with sheet resistance of 100 $\Omega/cm^2$ are shown in FIGS. 8(a), 8(b) and 8(c), respectively. In contrast to the constancy of the dielectric constant of the $BaTiO_3$ film independent of the film thickness for the case of using the multilayered film of the present embodiment, the dielectric constant of the dielectric film for the case of using the platinum film and the polycrystalline silicon film is reduced markedly with a decrease in the film thickness.

The drop of the dielectric constant for the case the polycrystalline silicon film is due to the formation of an oxide layer of silicon at the interface of the dielectric film and the electrode or the formation of a layer of low dielectric constant in the initial period of growth of a dielectric film, as has been reported in the past. In the case of the platinum film of FIG. 8(b), it is confirmed by X-ray diffraction after the formation of the dielectric film that silicidation of platinum occurred. This means that silicon reacted with platinum during the formation of the dielectric film at 600° C., and reached the uppermost surface while forming a silicide compound. Accordingly, it is considered that silicon existed in the uppermost surface of the electrode, and the layer of low dielectric constant was formed under the same condition as in the case of the polycrystalline silicon film. In contrast, it is confirmed by X-ray diffraction that in the case of the multilayered film of platinum and rhenium oxide, platinum remains in its original condition without silicidation thereof even after the formation of the dielectric substance. Namely, it is considered that the diffusion of silicon is obstructed by the rhenium oxide layer, being unable to reach the platinum layer, and there did not take place the aforementioned formation of a layer with low dielectric constant due to oxidation of silicon.

The effect of the present invention will not be diminished even when an adhesive layer made of titanium or the like is inserted between platinum and rhenium oxide in order to enhance the adhesion of platinum and rhenium oxide as is generally done. Moreover, similar result is obtained by using a high-melting point noble metal palladium or rhodium in place of platinum.

Furthermore, when osmium oxide, rhodium oxide or iridium oxide is used instead of rhenium oxide, there is also obtained a value of about 220 for the dielectric constant of the $BaTiO_3$ film formed thereon without having dependence on the film thickness.

Seventh Embodiment

In the present embodiment, the dependence of the dielectric constant of the $BaTiO_3$ film on the film thickness is investigated by using rhenium silicide for the first layer of the conductive layer in the thin film capacitor of the sixth embodiment. The rhenium silicide film is formed to a thickness of 1500 Å by a dc sputtering using a sintered target with the composition of Re : Si = 1 : 1.

In this case, an intrinsic value of about 220 which is independent of the film thickness is obtained as the dielectric constant of the $BaTiO_3$ film, analogous to the case of the sixth embodiment. However, according to an X-ray diffraction after the formation of the dielectric film, it is confirmed that silicidation of platinum occurred, differing from the case of rhenium oxide. From this fact it is considered that rhenium silicide does not at least have an effect of suppressing the diffusion of silicon as is the case for rhenium oxide so that silicon can reach the uppermost surface of the electrode, but the quality of the dielectric film formed thereon is different from that of the film formed on the platinum film in Embodiment 6.

It is confirmed in the present embodiment that a similar effect can be obtained when a rhenium film and osmium, rhodium or iridium or their silicides are used instead of rhenium silicide.

Eighth Embodiment

This is an embodiment in which an alloy film or a multilayered film consisting of high-melting point noble metal platinum, palladium and rhodium is used for the second layer of the conductive layer in the thin film capacitor of the sixth embodiment. The materials used for the present embodiment are listed in Table 3.

TABLE 3

| 1 | Alloy Film | Pt 85at % - Rh 15at %, 1500 Å |
| 2 | Alloy Film | Pt 80at % - Pd 20at %, 1500 Å |
| 3 | Alloy Film | Pd 90at % - Rh 10at %, 1500 Å |
| 4 | Multilayered Film | Pt(1000 Å)/Rh(500 Å) |
| 5 | Multilayered Film | Pt(1000 Å)/Pd(500 Å) |
| 6 | Multilayered Film | Pd(1000 Å)/Rh(500 Å) |

Analogous to the sixth embodiment, a dielectric constant of about 220 which is independent of the film thickness is obtained for the $BaTiO_3$ film, and the formation of a layer with low dielectric constant at the interface is prevented, also in the present embodiment. Moreover, it is confirmed by X-ray diffraction that silicidation of the alloy or the multilayered film of high-melting point noble metals of the second layer did not occur.

Ninth Embodiment

After formation of a 1500 Å-thick rhenium silicide by a dc sputtering as the first layer of the conductive layer in the same manner as in the seventh embodiment, the rhenium silicide film is oxidized by subjecting the film to a heat treatment in an atmosphere of oxygen gas at 500° C., then a platinum, $BaTiO_3$ and aluminum films are formed similar to the sixth embodiment.

Analogous to the sixth and seventh embodiments, there is obtained a dielectric constant of the $BaTiO_3$ film of about 220 which is independent of the film thickness. According to an X-ray diffraction test given after the formation of the dielectric film, it is found that silicidation of platinum does not occur in which point it differs from the result of the seventh embodiment. Namely, in spite of a large amount of silicon contained in the oxidized rhenium silicide film, diffusion of silicon to platinum is suppressed. For the oxidation of the rhenium silicide film it is found that an oxidation temperature of higher than 400° C. is required. The sheet resistance of the rhenium silicide film depends on the oxidation temperature which is about 10 Ω/square for the range of 400° C. to 600° C. but it begins to increase from 630° C. and it increases markedly to more than 100 Ω/square for oxidation at high temperatures above 700° C. Since a lower electrode resistance is preferred for a thin film capacitor, the temperature for the oxidation treatment of the rhenium silicide film is desirable to be in the range of 400° C. to 700° C.

One of the characteristics of the rhenium-silicon oxide film formed in the present embodiment is that it has a better adhesion to the silicon electrode than the rhenium oxide film formed in sixth embodiment. For example, when an oxide film consisting of rhenium-silicon of thickness of 1500 Å is formed on the silicon substrate in the same way as in the present embodiment, and a 2 μm-thick $BaTiO_3$ film is formed on top of it by sputtering, there occurred no peeling of the film. However, when a $BaTiO_3$ film with a thickness of more than 3500 Å is formed on a rhenium oxide film of thickness of 1500 Å formed on a silicon electrode as in the sixth embodiment, there was generated a complete peeling between the rhenium oxide film and the silicon electrode.

Furthermore, a result similar to the above is obtained when a rhenium film and osmium, rhodium or iridium or a silicide film of one of these metals is used in place of the rhenium silicide film of the present embodiment. That is, it is possible to form a $BaTiO_3$ film which has a dielectric constant of about 220 and is independent of the film thickness, and yet has an improved adhesion between these oxide films and the silicon electrode.

It should be mentioned that the description in the above has been given in conjunction with the $BaTiO_3$ film. However, the result of similar preparation and evaluation by the use of $SrTiO_3$, $PbTiO_3$, $PbZrO_3$, $LiNbO_3$, $Bi_4Ti_3O_{12}$ and the solid solutions $(Ba,Sr)TiO_3$, $(Ba,Pb)TiO_3$ and $Pb(Zr,Ti)O_3$ showed that dielectric constants intrinsic to the dielectric films that do not depend on the film thickness can be obtained.

What is claimed is:

1. A thin film capacitor comprising:
   a silicon electrode;
   a first electrode layer consisting essentially of a member selected from the group consisting of titanium, titanium silicide, titanium nitride, tantalum, molybdenum, tungsten, tantalum silicide, molybdenum silicide, tungsten silicide, alloys thereof and compounds thereof, formed on said silicon electrode;
   a second electrode layer consisting essentially of a high-melting point noble metal formed on said first electrode layer;
   a dielectric layer consisting essentially of an oxide ferroelectric material formed on said second electrode layer; and
   a third electrode layer formed on said dielectric layer.

2. A thin film capacitor as recited in claim 1, wherein said silicon electrode is one of polycrystalline silicon and single crystal silicon.

3. A thin film capacitor as recited in claim 1, wherein said high-melting point noble metal is a member selected from the group consisting of platinum, palladium, rhodium and alloys thereof.

4. A thin film capacitor as recited in claim 1 wherein said oxide ferroelectric material is a member selected from the group consisting of perovskite type oxides, ilmenite type oxides and $Bi_4Ti_3O_{12}$.

5. A thin film capacitor as recited in claim 1, wherein said oxide ferroelectric material is a member selected from the group consisting of $BaTiO_3$, $SrTiO_3$, $PbTiO_3$, $PbZrO_3$ and solid solutions thereof.

6. A method of manufacturing thin film capacitors comprising the steps of:
   forming a first electrode layer consisting essentially of a member selected from the group consisting of titanium, titanium silicide, titanium nitride, tantalum, molybdenum, tungsten, tantalum silicide, molybdenum silicide, tungsten silicide, alloys thereof and compounds thereof, on a silicon electrode;

forming a second electrode layer consisting essentially of high-melting point noble metal on said first electrode layer;

forming a dielectric layer consisting essentially of an oxide ferroelectric material on said second electrode layer; and forming a third electrode layer on said dielectric layer.

7. A method of manufacturing thin film capacitors as recited in claim 6, wherein said silicon electrode is one of polycrystalline silicon and single crystal silicon.

8. A method of manufacturing thin film capacitors as recited in claim 6, wherein said high-melting point noble metal is a member selected from the group consisting of platinum, palladium, rhodium and alloys thereof.

9. A method of manufacturing thin film capacitors as recited in claim 6, wherein said oxide ferroelectric material is a member selected from the group consisting of perovskite type oxides, ilmenite type oxides and $Bi_4Ti_3O_{12}$.

10. A method of manufacturing thin film capacitors as recited in claim 6, wherein said oxide ferroelectric substance is a member selected from the group consisting of $BaTiO_3$, $SrTiO_3$, $PbTiO_3$, $PbZrO_3$ and solid solutions thereof.

11. A thin film capacitor comprising:

a silicon electrode;

a first electrode layer consisting essentially of a member selected from the group consisting of rhenium oxide, osmium oxide, rhodium oxide, iridium oxide and compounds thereof, formed on said silicon electrode;

a second electrode layer consisting essentially of a high-melting point noble metal formed on said first electrode layer;

a dielectric layer consisting essentially of an oxide ferroelectric material formed on said second electrode layer; and a third electrode layer formed on said dielectric layer.

12. A thin film capacitor as recited in claim 11, wherein said silicon electrode is one of polycrystalline silicon and single crystal silicon.

13. A thin film capacitor as recited in claim 11, wherein said high-melting point noble metal is a member selected from the group consisting of platinum, palladium, rhodium and alloys thereof.

14. A thin film capacitor as recited in claim 11, wherein said oxide ferroelectric material is a member selected from the group consisting of perovskite type oxides, ilmenite type oxides and $Bi_4Ti_3O_{12}$.

15. A thin film capacitor as recited in claim 11, wherein said oxide ferroelectric material is a member selected from the group consisting of $BaTiO_3$, $SrTiO_3$, $PbTiO_3$, $PbZrO_3$ and solid solutions thereof.

16. A method of manufacturing this film capacitors comprising the steps of:

forming a first electrode layer consisting essentially of a member selected from the group consisting of rhenium oxide, osmium oxide, rhodium oxide, iridium oxide and compounds thereof, on a silicon electrode;

forming a second electrode layer consisting essentially of a high-melting point noble metal on said first electrode layer;

forming a dielectric layer consisting essentially of an oxide ferroelectric material on said second electrode layer; and forming a third electrode layer on said dielectric layer.

17. A method of manufacturing thin film capacitors as recited in claim 16, wherein said silicon electrode is one of polycrystalline silicon and single crystal silicon.

18. A method of manufacturing thin film capacitors as recited in claim 16, wherein said high-melting point noble metal is a member selected from the group consisting of platinum, palladium, rhodium and alloys thereof.

19. A method of manufacturing thin film capacitors as recited in claim 16, wherein said oxide ferroelectric material is a member selected from the group consisting of perovskite type oxides, ilmenite type oxides and $Bi_4Ti_3O_{12}$.

20. A method of manufacturing this film capacitors as recited in claim 16, wherein said oxide ferroelectric material is a member selected from the group consisting of $BaTiO_3$, $SrTiO_3$, $PbTiO_3$, $PbZrO_3$ and the solid solution thereof.

21. A method of manufacturing thin film capacitors comprising the steps of:

forming a first electrode layer consisting essentially of a member selected from the group consisting of rhenium silicide, osmium silicide, rhodium silicide, iridium silicide and compounds thereof, on a silicon electrode;

oxidizing, then, said first electrode layer at temperatures in the range of 400° C. to 700° C.;

forming a second electrode layer consisting essentially of a high-melting point noble metal on said oxidized first electrode layer;

forming a dielectric layer consisting essentially of an oxide ferroelectric material on said second electrode layer; and forming a third electrode layer on said dielectric layer.

22. A method of manufacturing thin film capacitors as recited in claim 21, wherein said silicon electrode is one of polycrystalline silicon and single crystal silicon.

23. A method of manufacturing thin film capacitors as recited in claim 21, wherein said high-melting point noble metal is a member selected from the group consisting of platinum, palladium, rhodium and alloys thereof.

24. A method of manufacturing thin film capacitors as recited in claim 21, wherein said oxide ferroelectric material is a member selected from the group consisting of perovskite type oxides, ilmenite type oxides and $Bi_4Ti_3O_{12}$.

25. A method of manufacturing thin film capacitors as recited in claim 21, wherein said oxide ferroelectric substance is a member selected from the group consisting of $BaTiO_3$, $SrTiO_3$, $PbTiO_3$, $PbZrO_3$ and the solid solutions thereof.

* * * * *